United States Patent [19]
Davis

[11] Patent Number: 4,914,321
[45] Date of Patent: Apr. 3, 1990

[54] BIMOS LEVEL CONVERTOR

[75] Inventor: Darrell E. Davis, Sunrise, Fla.

[73] Assignee: Motorola, Inc., Schaumburg, Ill.

[21] Appl. No.: 335,341

[22] Filed: Apr. 10, 1989

[51] Int. Cl.⁴ .......................................... H03K 19/08
[52] U.S. Cl. .................................... 307/446; 307/455; 307/475; 323/311
[58] Field of Search ..................... 307/446, 455, 475; 323/311

[56] References Cited

U.S. PATENT DOCUMENTS

| 4,135,103 | 1/1979 | Fulkerson | 307/455 |
| 4,437,171 | 3/1984 | Hudson et al. | 307/475 |
| 4,689,503 | 8/1987 | Suzuki et al. | 307/446 |
| 4,697,109 | 9/1987 | Honma et al. | 307/475 |
| 4,779,105 | 10/1988 | Erderlyi | 307/475 |
| 4,788,459 | 11/1988 | Tsugaru et al. | 307/446 |
| 4,794,317 | 12/1988 | van Tran | 323/316 |
| 4,798,981 | 1/1989 | Tsugaru et al. | 307/475 |
| 4,806,799 | 2/1989 | Pelly et al. | 307/455 |

Primary Examiner—Peter S. Wong
Assistant Examiner—Jeffrey Sterrett
Attorney, Agent, or Firm—Thomas G. Berry; Pablo Meles

[57] ABSTRACT

A BIMOS lever convertor (10) comprises a differential circuit having a common biasing network (14). A MOS transistor (16) in one portion of the differential circuit receives a MOS level input signal (32) and provides an ECL level output signal (34). The other portion of the differential circuit includes a bipolar transistor (18) that is biased by the MOS transistor (16). The bipolar transistor (18) operates to provide a complementary ECL level output signal (34') so as to provide a single ended MOS to differential ECL interface suitable for integration in an I.C.

14 Claims, 1 Drawing Sheet

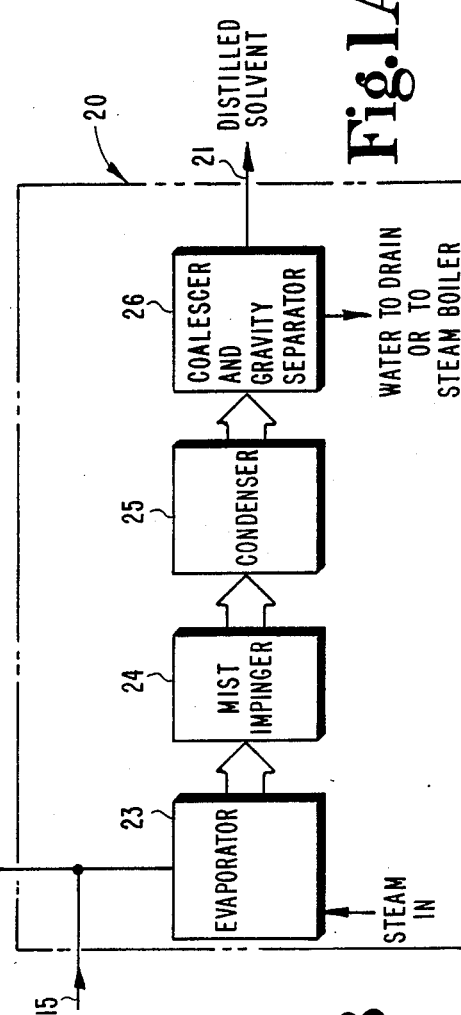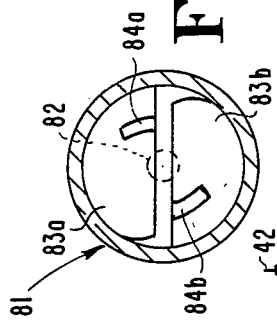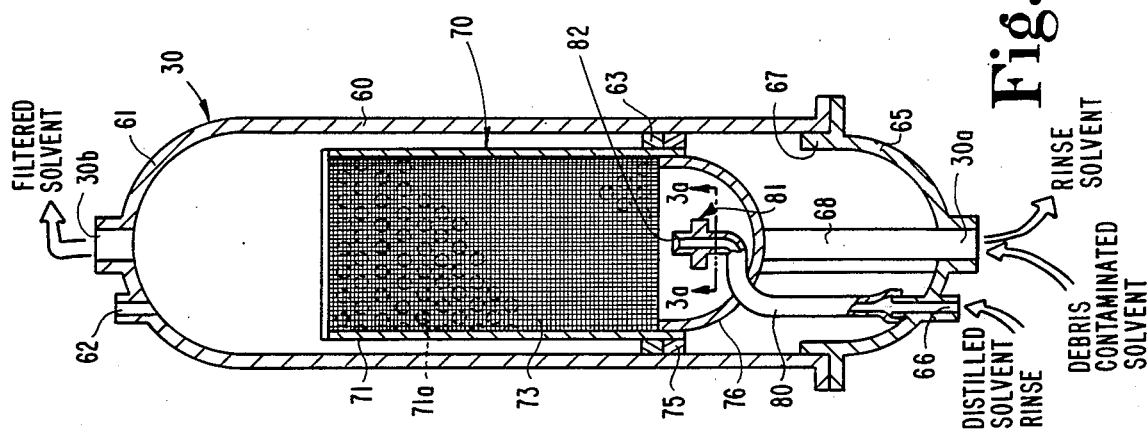

BIMOS LEVEL CONVERTOR

TECHNICAL FIELD

This invention relates generally to BIMOS logical circuits, more particularly to BIMOS circuits suitable for integration into integrated circuits (I.C.).

BACKGROUND ART

Contemporary BIMOS integrated processes enable I.C. manufacturers to integrate bipolar devices and MOS devices on the same I.C. chip. Accordingly, I.C. designers must provide circuitry to interface these differing technology devices since they customarily operate using different power supplies or voltage sources. I.C. designers are often frustrated in providing suitable interfacing circuitry because some MOS circuitry may operate using a single-ended signal, while emitter-coupled logic (ECL) bipolar circuitry often operates using complementary or differential signals.

One solution maybe to operate all devices using complementary signals. However, such practice complicates the MOS portion of the I.C. and may result in increased chip size to accommodate the additional runners required to form differential MOS circuitry. Accordingly, a need exists to provide a BIMOS level convertor capable of providing ECL compatible complementary signals that does not unnecessarily complicate the design of the I.C. or unduly increase chip size.

SUMMARY OF THE INVENTION

Accordingly, it is an object of the present invention to provide a BIMOS level converter that overcomes the detriments discussed above.

Briefly, according to the invention, a BIMOS level convertor comprises a differential circuit having a common biasing network. A MOS transistor in one portion of the differential circuit receives a MOS level input signal and provides an ECL level output signal. The other portion of the differential circuit includes a bipolar transistor that is biased by the MOS transistor. The bipolar transistor operates to provide a complementary ECL level output signal so as to provide a single ended MOS to differential ECL interface suitable for integration in an I.C.

DETAILED DESCRIPTION OF THE PREFERRED EMBODIMENT

Figure 1:
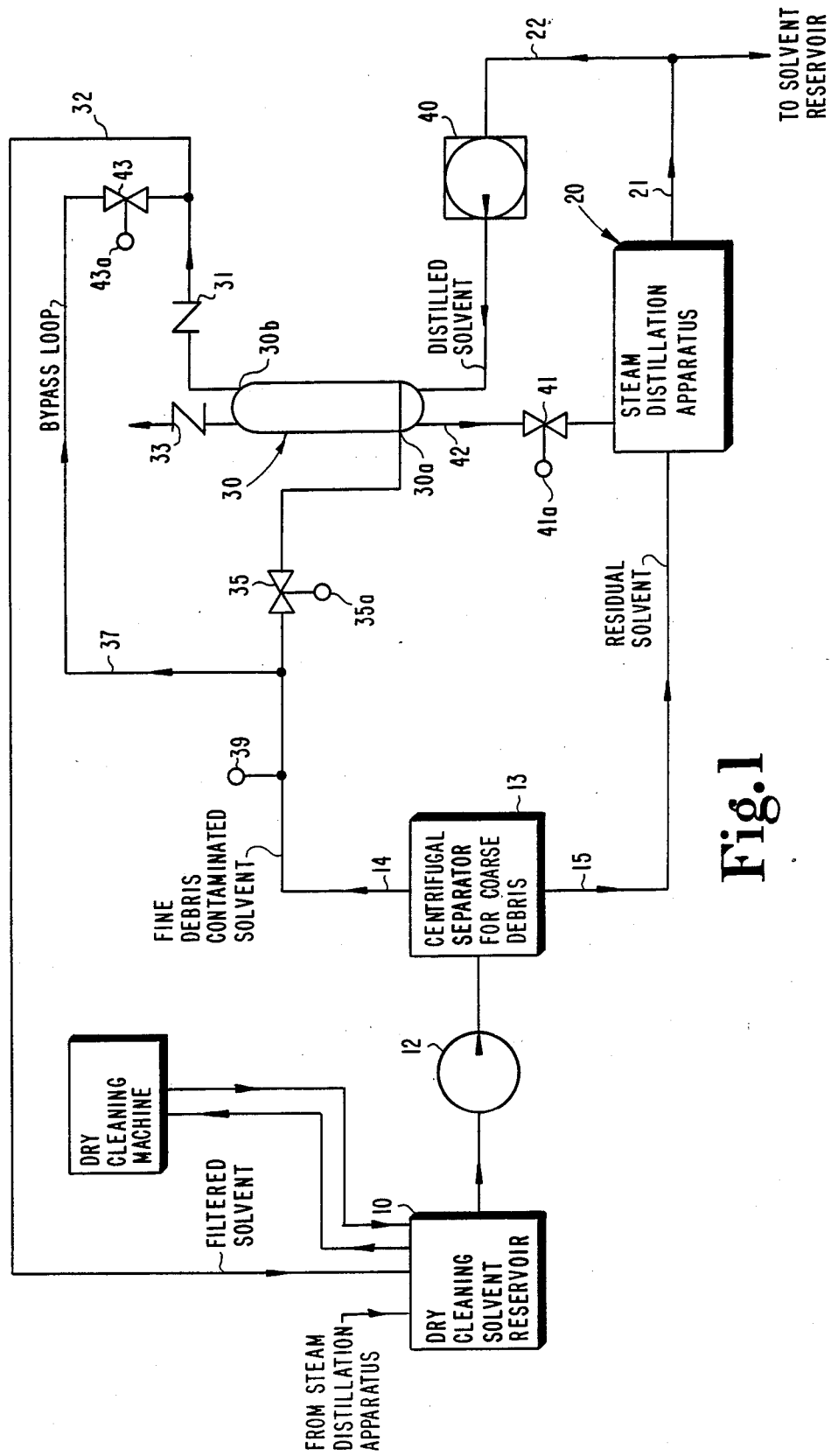
FIG. 1 is a schematic diagram of a BIMOS level convertor in accordance with the present invention.
Figure 2:
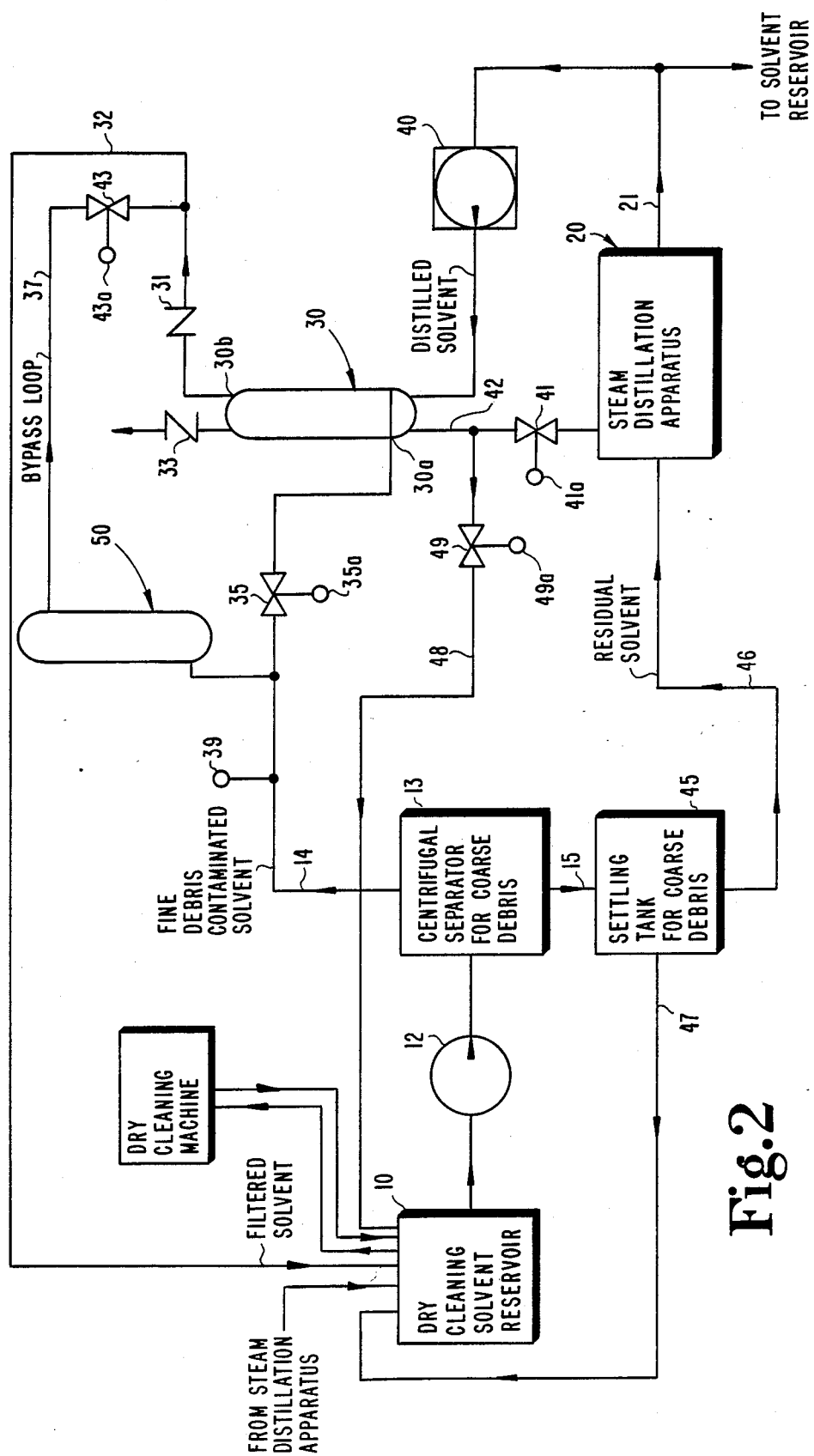
Figure 1:
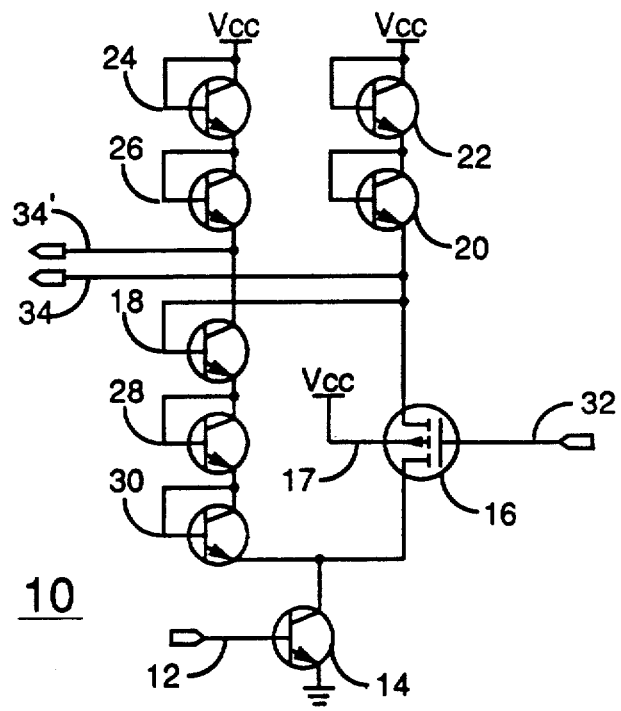

Referring to FIG. 1, there is shown a schematic diagram of a BIMOS level converter 10 in accordance with the present invention. Operationally, a bias current is received (12) by a biasing transistor 14, which defines a bias current for the BIMOS level convertor 10. Preferably, a biasing current of the present invention is 100 $\mu a$, although biasing currents in the range of 10-400 $\mu a$ maybe used depending upon the speed at which the BIMOS level shifter 10 operates. A MOS transistor 16 is biased (17) to receive a MOS-level signal at an input 32. As used in conjunction with the present invention, MOS level signals are contemplated to reside in a voltage range 0.5-4.5 volts.

Assuming that the MOS transistor 16 is receiving a logic zero level signal (i.e., approximately 0.5 volts) the MOS transistor 16 will enter a conductive state that draws current from a voltage source (Vcc) through two diodes 20 and 22. Accordingly, the voltage at the base of a bipolar transistor 18 will be approximately two diode-drops below the voltage source potential rendering the bipolar transistor 18 nonconductive. With no current flowing through bipolar transistor 18, the potential at a first output port 34' will rise to approximately to the voltage source potential (Vcc) forming a logic one diode loaded ECL compatible signal that is complementary (i.e., inverted) to the input signal received by the MOS transistor 16. That is, once the MOS transistor 16 receives a logic zero MOS-level input signal, a logic one ECL compatible output signal of approximately 200 mv is provided at the output port 34'. ECL compatible differential signals are readily provided by the BIMOS level converter 10 by providing a second diode-loaded signal from the diode 20. In this way, complementary (differential) ECL compatible output signals are provided at outputs 34 and 34' in response to MOS-level signals received (32) by the MOS transistor 16.

Assuming that the MOS transistor 16 receives a logic one level signal (i.e., approximately 4.5 volts), the MOS transistor 16 will enter a nonconductive state causing the potential at the output port 34 to rise approximately to Vcc. Preferably, the MOS transistor 16 comprises a P-channel device, which has the desirable property of displacing charge rapidly via paracitic capacitances between the gate and source of the MOS device. This results in an improved operational speed performance when the MOS transistor 16 moves from the conducting state to the nonconductive state.

As the potential at the output port 34 rises, the bipolar transistor 18 becomes conductive drawing current through the diodes 24 and 26, which is routed through diodes 28 and 30 to ground via the biasing transistor 14. Accordingly, the output voltage at the output port 34' falls from approximately Vcc to two diode-drops below Vcc, representing a logic zero ECL level signal. In this way, complementary (differential) ECL compatible output signals are maintained at outputs 34 and 34'.

According to the invention, the bipolar transistor 18 is biased by the MOS transistor 16 and the diode load (20 and 22). Therefore, diodes 28 and 30 are used to set an appropriate turn-on threshold between the MOS transistor 16 and the bipolar transistor 18. This allows the MOS portion of a BIMOS I.C. to operate in a single ended manner, while providing differential outputs for bipolar ECL circuitry. Of course, if differential ECL compatible signals are not required, the output port 34 maybe used to provide an in-phase level shifted signal or the output port 34' maybe used alone to provide a complementary (inverted) ECL compatible output signal.

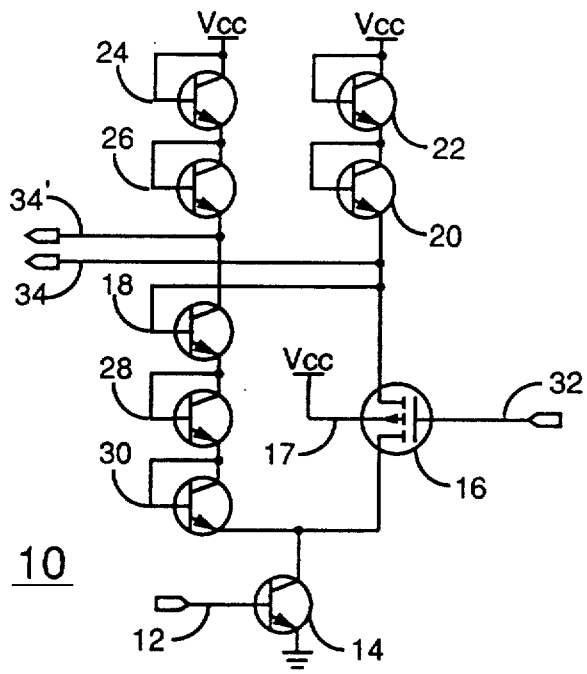

What is claimed is:

1. A BIMOS level converter, comprising:
   bias means for defining a bias current;
   a MOS transistor, disposed between said bias means and a first load coupled to a voltage source;
   a bipolar transistor, having first, second, and third ports, arranged such that said first port is coupled to said first load, said second port is coupled to a second load connected to said voltage source, and said third port is coupled to a third load connected to said bias means;

whereby, said MOS transistor receives an input signal, and said second port of said bipolar transistor provides an output signal.

2. The level converter of claim 1, wherein said MOS transistor comprises a P-channel MOS transistor.

3. The level convertor of claim 1, wherein said first, second, and third loads comprise diode loads.

4. The level convertor of claim 3, wherein said diode loads comprise two series diodes.

5. Level convertor of claim 1, wherein said bias means comprises an NPN bipolar transistor.

6. A BIMOS level convertor, comprising:
bias means for defining a bias current, said bias means being coupled to first and second portions of a differential circuit;
said first portion of said differential circuit comprising a MOS transistor for receiving an input signal, and a first load coupled to a voltage source;
said second portion of said differential circuit comprising of a bipolar transistor disposed between a second load and a third load, said second load being coupled to a second voltage source and said third load being coupled to said bias means, said bipolar transistor being biased by said MOS transistor and said first load and arranged to provide a complementary output signal.

7. The level converter of claim 6, wherein said MOS transistor comprises a P-channel MOS transistor.

8. The level converter of claim 6, wherein said first, second, and third loads comprise diode loads.

9. The level convertor of claim 8, wherein said diode loads comprise two series diodes.

10. Level convertor of claim 6, wherein said bias means comprises an NPN bipolar transistor.

11. A BIMOS level converter, comprising:
bias means for defining a bias current;
an MOS transistor, disposed between said bias means and a first diode load being coupled to a voltage source;
a bipolar transistor, having collector, base, and emitter, arranged such that said collector is coupled to said first diode load, said base being coupled to a second diode load connected to said voltage source, and said emitter coupled to a third diode load connected to said bias means;
whereby, said MOS transistor receives an input signal, and said collector and base of said bipolar transistor provides complementary output signals.

12. A BIMOS level convertor, comprising:
bias means for defining a bias current;
a P-channel MOS transistor for receiving a MOS level signal, said BIMOS transistor being disposed between said bias means and a first diode load being coupled to a voltage source;
a bipolar transistor, having collector, base, and emitter, arranged such that said collector is coupled to said first diode load, said base being coupled to a second diode load connected to said voltage source, and said emitter coupled to a third diode load connected to said bias means;
whereby, said P-channel MOS transistor receives said MOS level input signal, and said collector and base of said bipolar transistor provides complementary output signals.

13. A method for converting a MOS level signal to complementary ECL level signals, comprising the steps of:
(a) receiving the MOS level signal;
(b) processing the MOS level signal to provide an ECL level output signal;
(c) biasing a bipolar transistor with said ECL level output signal to provide a complementary ECL level output signal, said complementary ECL level output signal being substantially 180 degrees out of phase with the ECL level output signal.

14. A method for converting a MOS level signal to complementary ECL level signals, comprising:
(a) receiving the MOS level signal;
(b) processing the MOS level signal to provide a bias signal, the bias signal also being an ECL level output signal;
(c) biasing a bipolar transistor with said bias signal to provide a complementary ECL level output signal.

* * * * *

UNITED STATES PATENT AND TRADEMARK OFFICE
CERTIFICATE OF CORRECTION

PATENT NO. : 4,914,321

DATED : April 3, 1990

INVENTOR(S) : Darrell E. Davis

It is certified that error appears in the above-identified patent and that said Letters Patent is hereby corrected as shown below:

The title page showing the illustrative figure should be deleted to appear as per attached title page.

The three drawing sheets should be deleted to be replaced with the attached sheet, consisting of figure 1.

Signed and Sealed this

Eleventh Day of June, 1991

*Attest:*

HARRY F. MANBECK, JR.

*Attesting Officer*   *Commissioner of Patents and Trademarks*

United States Patent [19]

Davis

[11] Patent Number: 4,914,321
[45] Date of Patent: Apr. 3, 1990

[54] BIMOS LEVEL CONVERTOR
[75] Inventor: Darrell E. Davis, Sunrise, Fla.
[73] Assignee: Motorola, Inc., Schaumburg, Ill.
[21] Appl. No.: 335,341
[22] Filed: Apr. 10, 1989
[51] Int. Cl.⁴ ............................................. H03K 19/08
[52] U.S. Cl. ................................. 307/446; 307/455; 307/475; 323/311
[58] Field of Search .................. 307/446, 455, 475; 323/311

[56] References Cited

U.S. PATENT DOCUMENTS

| | | | |
|---|---|---|---|
| 4,135,103 | 1/1979 | Fulkerson | 307/455 |
| 4,437,171 | 3/1984 | Hudson et al. | 307/475 |
| 4,689,503 | 8/1987 | Suzuki et al. | 307/446 |
| 4,697,109 | 9/1987 | Honma et al. | 307/475 |
| 4,779,105 | 10/1988 | Erderlyi | 307/475 |
| 4,788,459 | 11/1988 | Tsugaru et al. | 307/446 |
| 4,794,317 | 12/1988 | van Tran | 323/316 |
| 4,798,981 | 1/1989 | Tsugaru et al. | 307/475 |
| 4,806,799 | 2/1989 | Pelly et al. | 307/455 |

Primary Examiner—Peter S. Wong
Assistant Examiner—Jeffrey Sterrett
Attorney, Agent, or Firm—Thomas G. Berry; Pablo Meles

[57] ABSTRACT

A BIMOS lever convertor (10) comprises a differential circuit having a common biasing network (14). A MOS transistor (16) in one portion of the differential circuit receives a MOS level input signal (32) and provides an ECL level output signal (34). The other portion of the differential circuit includes a bipolar transistor (18) that is biased by the MOS transistor (16). The bipolar transistor (18) operates to provide a complementary ECL level output signal (34') so as to provide a single ended MOS to differential ECL interface suitable for integration in an I.C.

14 Claims, 1 Drawing Sheet